United States Patent
Paquet et al.

(10) Patent No.: US 11,746,246 B2
(45) Date of Patent: Sep. 5, 2023

(54) SILVER MOLECULAR INK WITH LOW VISCOSITY AND LOW PROCESSING TEMPERATURE

(71) Applicant: National Research Council of Canada, Ottawa (CA)

(72) Inventors: Chantal Paquet, Ottawa (CA); Xiangyang Liu, Ottawa (CA); Arnold J. Kell, Ottawa (CA); Patrick Roland Lucien Malenfant, Ottawa (CA); Bhavana Deore, Ottawa (CA)

(*) Notice: Subject to any disclaimer, the term of this patent is extended or adjusted under 35 U.S.C. 154(b) by 141 days.

(21) Appl. No.: 16/483,293

(22) PCT Filed: Feb. 8, 2018

(86) PCT No.: PCT/IB2018/050791
§ 371 (c)(1),
(2) Date: Aug. 2, 2019

(87) PCT Pub. No.: WO2018/146619
PCT Pub. Date: Aug. 16, 2018

(65) Prior Publication Data
US 2019/0375958 A1    Dec. 12, 2019

Related U.S. Application Data

(60) Provisional application No. 62/456,322, filed on Feb. 8, 2017.

(51) Int. Cl.
*C09D 11/52* (2014.01)
*C09D 11/037* (2014.01)

(52) U.S. Cl.
CPC ............ *C09D 11/52* (2013.01); *C09D 11/037* (2013.01)

(58) Field of Classification Search
CPC ...................................................... C09D 11/52
See application file for complete search history.

(56) References Cited

U.S. PATENT DOCUMENTS

| | | | |
|---|---|---|---|
| 3,228,897 A | 1/1966 | Nellessen et al. |
| 3,702,259 A | 11/1972 | Nielsen |
| 3,729,339 A | 4/1973 | Kiel |
| 3,989,644 A | 11/1976 | Bolon et al. |

(Continued)

FOREIGN PATENT DOCUMENTS

| CA | 2017808 A1 | 12/1990 |
|---|---|---|
| CN | 1071182 A | 4/1993 |

(Continued)

OTHER PUBLICATIONS

First Examination report dated Mar. 17, 2021 on Indian patent application 201927032158.

(Continued)

*Primary Examiner* — William D Young
(74) *Attorney, Agent, or Firm* — BRUNET & CO., LTD.; Hans Koenig; Robert Brunet

(57) ABSTRACT

A molecular ink contains: a silver carboxylate; and a polymeric binder comprising a polyester, polyimide, polyether imide or any mixture thereof having functional groups that render the polymeric binder compatible with the organic amine. Such an ink may have higher silver loading, lower viscosity and lower processing temperatures than existing silver inks.

15 Claims, 3 Drawing Sheets

(56) References Cited

U.S. PATENT DOCUMENTS

| | | | |
|---|---|---|---|
| 4,088,801 A | 5/1978 | Bolon et al. | |
| 4,099,376 A | 7/1978 | Japs | |
| 4,180,407 A | 12/1979 | Gibson et al. | |
| 4,248,921 A | 2/1981 | Steigerwald et al. | |
| 4,396,666 A | 8/1983 | Ernsberger | |
| 4,487,811 A | 12/1984 | Eichelberger et al. | |
| 4,552,690 A | 11/1985 | Nobuyuki et al. | |
| 4,687,597 A | 8/1987 | Siuta | |
| 4,775,594 A | 10/1988 | Desjarlais | |
| 4,857,111 A | 8/1989 | Haubennestel et al. | |
| 5,045,236 A | 9/1991 | Tsunaga et al. | |
| 5,248,451 A | 9/1993 | Tsunaga et al. | |
| 5,306,590 A | 4/1994 | Felder | |
| 5,900,327 A | 5/1999 | Pei et al. | |
| 5,960,251 A | 9/1999 | Brusic et al. | |
| 5,980,622 A | 11/1999 | Byers | |
| 5,989,700 A | 11/1999 | Krivopal | |
| 6,036,889 A | 3/2000 | Kydd | |
| 6,048,389 A | 4/2000 | Price et al. | |
| 6,090,890 A | 7/2000 | Murakami et al. | |
| 6,521,032 B1 | 2/2003 | Lehmann et al. | |
| 6,663,799 B2 | 12/2003 | Kokubo et al. | |
| 6,770,122 B2 | 8/2004 | Thompson | |
| 7,141,104 B2 | 11/2006 | De Voeght et al. | |
| 7,211,205 B2 | 5/2007 | Conaghan et al. | |
| 7,473,307 B2 | 1/2009 | Song et al. | |
| 7,566,357 B2 | 7/2009 | Zhao | |
| 7,629,017 B2 | 12/2009 | Kodas et al. | |
| 7,731,812 B2 | 6/2010 | Wang et al. | |
| 7,960,037 B2 | 6/2011 | Liu et al. | |
| 8,043,535 B2 | 10/2011 | Kamikoriyama et al. | |
| 8,262,894 B2 | 9/2012 | Xu et al. | |
| 8,282,860 B2 | 10/2012 | Chung et al. | |
| 8,339,040 B2 | 12/2012 | Bruton et al. | |
| 8,597,397 B2 | 12/2013 | Kunze et al. | |
| 8,945,328 B2 | 2/2015 | Longinotti-Buitoni et al. | |
| 8,948,839 B1 | 2/2015 | Longinotti-Buitoni et al. | |
| 9,028,599 B2 | 5/2015 | Abe | |
| 9,145,503 B2 | 9/2015 | Yu et al. | |
| 9,187,657 B2 | 11/2015 | Yano et al. | |
| 9,198,288 B2 | 11/2015 | Wu et al. | |
| 9,283,618 B2 | 3/2016 | Wu et al. | |
| 9,460,824 B2 | 10/2016 | Liu et al. | |
| 10,883,011 B2 * | 1/2021 | Kell | C09D 11/38 |
| 2003/0180451 A1 | 9/2003 | Kodas et al. | |
| 2005/0070629 A1 | 3/2005 | Roberts | |
| 2006/0118768 A1 | 6/2006 | Liu et al. | |
| 2007/0078215 A1 | 4/2007 | Yoon et al. | |
| 2007/0125989 A1 | 6/2007 | Kodas et al. | |
| 2007/0154644 A1 | 7/2007 | Hwang et al. | |
| 2008/0093422 A1 | 4/2008 | Kodas et al. | |
| 2008/0108218 A1 | 5/2008 | Kodas et al. | |
| 2008/0178761 A1 | 7/2008 | Fomotake et al. | |
| 2009/0267060 A1 | 10/2009 | Forrest et al. | |
| 2010/0048813 A1 * | 2/2010 | Clauss | C08G 83/005 524/604 |
| 2011/0111138 A1 | 5/2011 | McCullough et al. | |
| 2012/0104330 A1 | 5/2012 | Choi et al. | |
| 2013/0121872 A1 | 5/2013 | Matsumoto | |
| 2013/0156971 A1 | 6/2013 | McCullough et al. | |
| 2013/0161573 A1 | 6/2013 | Torardi et al. | |
| 2013/0277096 A1 | 10/2013 | Seong et al. | |
| 2014/0076620 A1 * | 3/2014 | Son | H01B 1/02 174/257 |
| 2014/0124713 A1 | 5/2014 | Majumdar et al. | |
| 2014/0178601 A1 | 6/2014 | Wei et al. | |
| 2014/0034901 A1 | 11/2014 | Abe | |
| 2014/0342083 A1 * | 11/2014 | Wu | B22F 1/0059 427/126.1 |
| 2014/0349017 A1 | 11/2014 | Abe | |
| 2014/0349025 A1 | 11/2014 | Hui et al. | |
| 2015/0004325 A1 | 1/2015 | Walker et al. | |
| 2015/0056426 A1 | 2/2015 | Grouchko et al. | |
| 2015/0132476 A1 | 5/2015 | Wu et al. | |
| 2015/0257279 A1 | 9/2015 | Shahbazi et al. | |
| 2015/0259557 A1 | 9/2015 | Sekiguchi et al. | |
| 2015/0298248 A1 | 10/2015 | Walker et al. | |
| 2015/0299489 A1 | 10/2015 | Walker | |
| 2016/0081189 A1 | 3/2016 | Shimoda et al. | |
| 2016/0095547 A1 | 4/2016 | Wang et al. | |
| 2016/0168408 A1 | 6/2016 | Cho et al. | |

FOREIGN PATENT DOCUMENTS

| | | |
|---|---|---|
| CN | 101271929 A | 9/2008 |
| CN | 101519356 A | 9/2009 |
| CN | 102270514 A | 12/2011 |
| CN | 102618033 A | 8/2012 |
| CN | 102863845 A | 1/2013 |
| CN | 103084581 A | 5/2013 |
| CN | 104263082 A | 1/2015 |
| CN | 104479463 A | 4/2015 |
| CN | 104024351 B | 11/2016 |
| CN | 106147405 A | 11/2016 |
| EP | 0335237 A2 | 10/1989 |
| EP | 2871260 A1 | 5/2015 |
| GB | 1443099 A | 7/1976 |
| JP | S61136978 A | 6/1986 |
| JP | 63278983 A | 11/1988 |
| JP | H10279868 A | 10/1998 |
| JP | 2000136333 A | 5/2000 |
| JP | 2004162110 A | 6/2004 |
| JP | 2005537386 A | 12/2005 |
| JP | 2008013466 A | 1/2008 |
| JP | 2008031104 A | 2/2008 |
| JP | 2009212182 A | 9/2009 |
| JP | 2009256218 A | 11/2009 |
| JP | 20100018696 A | 1/2010 |
| JP | 2012234803 A | 11/2012 |
| JP | 2014148732 A | 8/2014 |
| JP | 2014182913 A | 9/2014 |
| JP | 2015/109273 A | 6/2015 |
| JP | 2015187259 A | 10/2015 |
| KR | 20110002022 A | 1/2011 |
| KR | 20120132424 A | 12/2012 |
| KR | 101350507 B | 1/2014 |
| KR | 20150045605 A | 4/2015 |
| KR | 20150077676 A | 7/2015 |
| KR | 20150082133 A | 7/2015 |
| KR | 20150085332 A | 7/2015 |
| TW | 200416261 A | 9/2004 |
| TW | 201406991 A | 2/2014 |
| TW | 201437299 A | 10/2014 |
| WO | 03/032084 A2 | 4/2003 |
| WO | 2003/095701 A1 | 11/2003 |
| WO | 2006/093398 A1 | 9/2006 |
| WO | 2009/036921 A1 | 3/2009 |
| WO | 2009/126918 A1 | 10/2009 |
| WO | 2010/036397 A2 | 4/2010 |
| WO | 2010/128107 A1 | 11/2010 |
| WO | 2012/135551 A1 | 10/2012 |
| WO | 2013/036519 A1 | 3/2013 |
| WO | 2013/073331 A1 | 5/2013 |
| WO | 2013/073349 A1 | 5/2013 |
| WO | 2013/096664 A1 | 6/2013 |
| WO | 2013/128449 A2 | 9/2013 |
| WO | 2012/133767 A1 | 7/2014 |
| WO | 2015/024115 A1 | 2/2015 |
| WO | 2015/160938 A1 | 10/2015 |
| WO | 2015/183679 A1 | 12/2015 |
| WO | 2015/192248 A1 | 12/2015 |
| WO | 2016/012753 A1 | 1/2016 |

OTHER PUBLICATIONS

Stay D, et al. Macromolecules. 2013, 46, 4361-4369.
Suran S, et al. Thin Solid Films. 2016, 607, 36-42.
Szeremeta J, et al. Optical Materials. 2011, 33, 1372-1376.
Tsai C-Y, et al. Nanoscale Research Letters. 2015, 10, 357 (7 pages).
Vaseem M, et al. ACS Appl. Mater. Interfaces. 2016, 8, 177-186.
Walker SB, et al. J. Am. Chem.Soc. 2012, 134, 1419-1421.
Wang H, et al. small. 2015, 11(1), 126-133.
Yabuki A, et al. Thin Solid Films. 2011, 519, 6530-6533.

(56) References Cited

OTHER PUBLICATIONS

Yabuki A, et al. Materials Research Bulletin. 2012, 47, 4107-4111.
Yabuki A, et al. Synthesis of copper conductive film by low-temperature thermal decomposition of coppereaminediol complexes under an air atmosphere. Materials Chemistry and Physics. 2014, http://dx.doi.org/10.1016/j.matchemphys.2014.07.047, 1e6.
Yim C, et al. ACS Appl. Mater. Interfaces. 2016, 8, 22369-22373.
Yong Y, et al. Scientific Reports. 7, 45150, DOI: 10.1038/srep45150, 9 pages.
Zhai D, et al. Colloids and Surfaces A: Physicochem. Eng. Aspects. 2013, 424, 1-9.
Zhu X, et al. Langmuir. 2012, 28, 14461-14469.
Stranks SD, et al. Adv. Mater. 2013, 25, 4365-4371.
Araki T, et al. Langmuir. 2013, 29, 11192-11197.
Bjornholm, T et al. J. Am. Chem. Soc. 1998, 120, 7643-7644.
Chen W, et al. Journal of Electronic Materials. 2015, 44(7), 2479-2487.
Choi T-H, et al. Journal of Materials Chemistry. 2012, 22, 3624.
Chung W-H, et al. Thin Solid Films. 2015, 580, 61-70.
Curtis C, et al. NCPV Program Review Meeting Conference Paper (Lakewood Colorado). Metallizations by Direct-Write Inkjet Printing. NREL/CP-520-31020, 2001, 6 pages.
Dang Z-M, et al. Journal of Applied Polymer Science. 2012, 126, 815-821.
Dearden AL, et a. Macromol. Rapid Commun. 2005, 26, 315-318.
De Boer B, et al. Macromolecules. 2002, 35, 6883-6892.
Deore B, et al. Conference Poster. New Conductors for Advanced User Interfaces, Circuits and Devices. Canadian Society for Chemistry. 2015.
Ding J, et al. Nanoscale. 2014, 6, 2328-2339.
Dong Y, et al. Thin Solid Films. 2015, 589, 381-387.
Farraj Y, et al. Chem. Commun., 2015, 51, 1587-1590.
Gu L, et al. Applied Mechanics and Materials Online. 2013, 469, 51-54.
Henkel's Printed Electronic Inks. Product Brochure F_LR615251. 2015.
Hokita Y, et al. ACS Appl. Mater. Interfaces. 2015, 7, 19382-19389.
Hu Y, et al. 15th International Conference on Electronic Packaging Technology. 2014, 1565-1567.
Hwang J, et al. Bull. Korean Chem. Soc. 2014, 35(1), 147-150.
International Preliminary Report on Patentability for PCT/IB2018/050788 dated Jul. 24, 2018.
International Preliminary Report on Patentability for PCT/IB2018/050789 dated Jul. 23, 2018.
International Preliminary Report on Patentability for PCT/IB2018/050790 dated Jul. 17, 2018.
International Preliminary Report on Patentability for PCT/IB2018/050791 dated Jul. 25, 2018.
International Search Report for PCT/IB2018/050788 dated Jul. 24, 2018.
International Search Report for PCT/IB2018/050789 dated Jul. 23, 2018.
International Search Report for PCT/IB2018/050790 dated Jul. 17, 2018.
International Search Report for PCT/IB2018/050791 dated Jul. 25, 2018.
Jahn SF, et al. Thin Solid Films. 2010, 518, 3218-3222.
Kamyshny A, et al. The Open Applied Physics Journal. 2011, 4, 19-36.
Kawaguchi Y, et al. Journal of Coating Science and Technology. 2016, 3(2), 56-61.
Kim SJ, et al. Thin Solid Films. 2012, 520, 2731-2734.
Kim I, et al. RSC Advances. 2013, 3, 15169-15177 (with ESI).
Lee B, et al. Current Applied Physics. 2009, 9, e157-e160.
Li Y, et al. J Mater Sci: Mater Electron. 2016, 27, 11432-11438.
Li W, et al. J. Mater. Chem. C. 2016, 4, 8802-8808.
Lin H-C, et al. Microelectronic Engineering. 2009, 86, 2316-2319.
Lyons AM, et al. Abstract of J. Phys. Chem. 1991, 95(3), 1098-1105.
Malenfant PRL, et al. NRC Printable Electronics. Presentation at IDTechEx (Santa Clara 2013).
Nie X, et al. Applied Surface Science. 2012, 261, 554-560.
Pacioni NL, et al. Silver Nanoparticle Applications, Engineering Materials. (Springer International Publishing Switzerland 2015, E.I. Alarcon et al. (eds.), DOI 10.1007/978-3-319-11262-6_2) pp. 13-46.
Paquet C, et al. New Conductors for Advanced User Interfaces, Circuits and Devices. Poster Presentation at CPEIA 2015.
Park K-H, et al. J. Am. Chem. Soc. 2005, 127(26), 9330-9331.
Pham LQ, et al. Journal of Colloid and Interface Science. 2012, 365, 103-109.
Polzinger B, et al. 2011 11th IEEE International Conference on Nanotechnology. (Portland Marriott. Aug. 15-18, 2011, Portland, Oregon, USA) pp. 201-204.
Rajan K, et al. Nanotechnology, Science and Applications. 2016, 9, 1-13.
Rao RVK, et al. RSC Adv. 2015, 5, 77760-77790.
Sakamoto M, et al. Journal of Photochemistry and Photobiology C: Photochemistry Reviews. 2009, 10, 33-56.
Schulz DL, et al. Electrochemical and Solid-State Letters. 2001, 4(8), C58-C61.
Shen L, et al. Journal of Electronic Materials. 2015, 44(2), 720-724.
Shin D-Y, et al. J. Mater. Chem. 2012, 22, 11755-11764.
Shin D-H, et al. ACS Appl. Mater. Interfaces. 2014, 6, 3312-3319.
Extended European Search Report dated Sep. 10, 2020 on European application 18751917.8/.
Search report dated Jul. 1, 2021 and Office Action dated Jul. 7, 2021 on Taiwan application 107104321.
Search report dated Aug. 3, 2021 and Office Action dated Aug. 12, 2021 on Chinese application 2018800162233.
Office Action dated Jan. 7, 2022 on Japanese patent application 2019-563711.
Office Action dated Jan. 5, 2022 on Chinese application 2018800162233.
Office action dated Jan. 22, 2022 on Taiwan patent application 107104321.
Office Action dated May 18, 2022 on Chinese application 2018800162233.
Office Action dated Aug. 22, 2022 on Korean application 10-2019-7026339.
Office Action dated Aug. 18, 2022 on Japanese application 2019-563711.
Office Action dated Apr. 12, 2023 on European application 18751917.8.

\* cited by examiner

SILVER MOLECULAR INK WITH LOW VISCOSITY AND LOW PROCESSING TEMPERATURE

CROSS-REFERENCE TO RELATED APPLICATIONS

This application is a National Entry of International Application PCT/IB2018/050791 filed Feb. 8, 2018, and claims the benefit of United States Provisional Application U.S. Ser. No. 62/456,322 filed Feb. 8, 2017.

FIELD

This application relates to inks, particularly to low-viscosity printable molecular inks that have high silver loading and can be sintered at relatively low temperature.

BACKGROUND

Molecular inks based on silver neodecanoate have been formulated for screen printing. Although these inks have demonstrated excellent mechanical and electrical properties while also having good printing qualities, they have at least two limitations.

First, due to their low solubility in solvent or carriers, the silver salt must be diluted significantly in order to form a uniform ink. The low concentration of silver salt results in thin silver deposits once printed. The resulting ink also has a relatively high viscosity, greater than what is required for many printing techniques (aerosol jet, inkjet printing, flexogravure printing). In order to print thick traces of silver neodecanoate inks, multiple layers are printed (inkjet or aerosol jet). If the printing technique requires a low viscosity ink, then the silver neodecanoate ink must be diluted reducing the relative silver content of the ink, which in turn yields very thin deposits. Further, printing multiple layers is time demanding and can lead to poor print quality.

Second, these inks require a processing temperature of approximately 220-240° C., therefore thermal sintering is generally only compatible with high cost substrates such as Kapton™ when seeking the highest conductivities. Traces of silver neodecanote inks can be sintered at lower temperatures however only if longer processing times are used.

Therefore, there is a need for a silver salt ink formulation, especially a silver neodecanoate formulation that allows higher loading of the silver salt and/or allows the silver to be sintered at lower temperatures.

SUMMARY

A molecular silver ink has been formulated that increases dispersibility (e.g. solubility) of the silver salt in the ink thereby increasing silver loading in the ink. The formulated ink may have lower viscosity than existing silver inks without compromising silver content. The silver ink may also require lower processing temperatures than existing silver inks.

In one aspect, there is provided a molecular ink comprising: a silver carboxylate; an organic amine; and a polymeric binder comprising a polyester, polyimide, polyether imide or any mixture thereof having functional groups that render the polymeric binder compatible with the organic amine.

In another aspect, there is provided a process for producing a conductive silver trace on a substrate, the process comprising depositing the molecular ink onto a substrate to form a non-conductive trace of the ink on the substrate, and sintering the non-conductive trace of the ink on the substrate to form the conductive silver trace.

In another aspect, there is provided a substrate comprising a conductive silver trace produced by a process as described above.

In another aspect, there is provided an electronic device comprising a substrate having a conductive silver trace produced by a process as described above.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which.

DETAILED DESCRIPTION

Figure 1A:
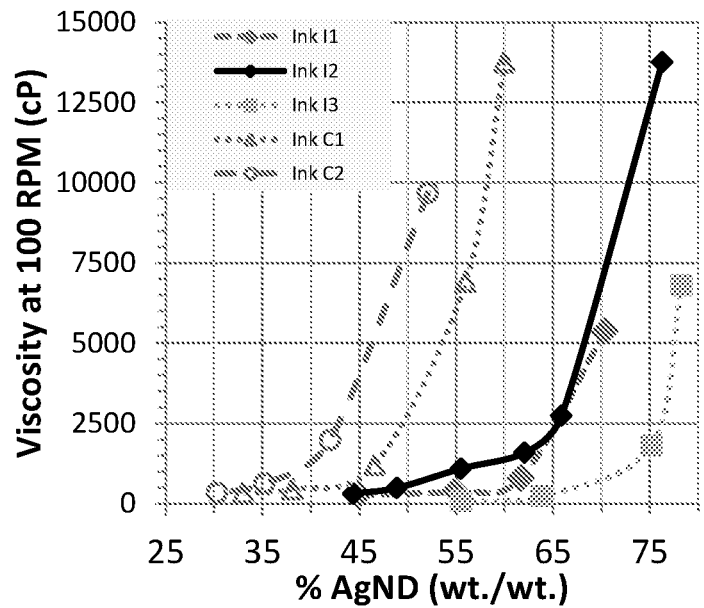
FIG. 1A and FIG. 1B depict graphs of viscosity (cP) of various inks as a function of silver neodecanoate (AgND) weight fraction (wt/wt) plotted on a linear scale (FIG. 1A) and a semi-log scale (FIG. 1B). A black horizontal dashed line at 500 cP viscosity in FIG. 1B shows that that Ink I1, Ink I2 and Ink I3 have greater AgND loading at 500 cP than Ink C1 and Ink C2.
Figure 1B:
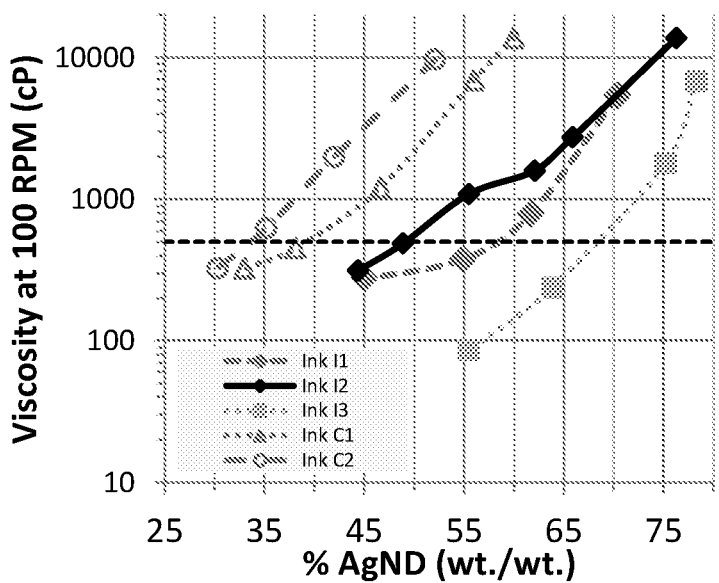

Silver carboxylates comprise a silver ion and an organic group containing a carboxylic acid moiety. The carboxylate group preferably comprises from 1 to 20 carbon atoms, more preferably from 6 to 15 carbon atoms, even more preferably from 8 to 12 carbon atoms, for example 10 carbon atoms. The carboxylate is preferably an alkanoate. The silver carboxylate is preferably a silver salt of an alkanoic acid. Some non-limiting examples of preferred silver carboxylates are silver ethylhexanoate, silver neodecanoate, silver benzoate, silver phenylacetate, silver isobutyrylacetate, silver benzoylacetate, silver oxalate, silver pivalate and any mixtures thereof. Silver neodecanoate is particularly preferred. One or more than one silver carboxylate may be in the ink. The silver carboxylate is preferably dispersed in the ink. Preferably, the ink does not contain flakes or other particles of metallic silver material.

The silver carboxylate is preferably present in the ink in an amount to provide a silver loading of about 23 wt % or more in the ink, based on total weight of the ink. More preferably, the silver carboxylate provides a silver loading of about 23.5 wt % or more, or about 25 wt % or more, or about 26.5 wt % or more, or about 27 wt % or more. When the silver carboxylate is silver neodecanoate, the silver neodecanoate may be preferably present in the ink in an amount of about 61 wt % or more, based on total weight of the ink, or about 65 wt % or more, or about 68 wt % or more, or about 70 wt % of more.

The organic amine is preferably an alkylamine, a hydroxyalkylamine or a cyclic amine. The organic amine preferably comprises from 2 to 12 carbon atoms, more preferably from 2 to 8 carbon atoms. Some non-limiting examples of alkylamines are 2-ethyl-1-hexylamine, 1-octylamine, 1-hexylamine, and the like. Some non-limiting examples of hydroxyalkylamines are 1,2-ethanolamine, 1-aminoisopropanol (amino-2-propanol), 1,3-propanolamine, 1,4-butanolamine, and the like. Some non-limiting examples of cyclic amines are pyridines, pyrimidines, pyrroles, pyrrolidines, oxazolines, piperidines, isoxazoles, morpholines, and the like. One or more than one organic amine may be in the ink.

The organic amine may be present in the ink in any suitable amount, preferably in an amount of about 5 wt % or more, more preferably about 8 wt % or more, and preferably in an amount of about 50 wt % or less, more preferably about 25 wt % or less, even more preferably about 20 wt % or less, all weights based on total weight of the ink. Exemplary preferred ranges are about 5 wt % to about 50 wt %, or about 10 wt % to about 50 wt %, or about 5 wt % to about 25 wt %.

The polymeric binder may comprise a polyester, polyimide, polyether imide or any mixture thereof having functional groups that render the polymeric binder compatible with the organic amine. Thus, a mixture of the organic amine in the polymeric binder does not lead to significant phase separation. The polymeric binder may be dispersible, for example soluble, in the organic amine. Functional groups that render the polymeric binder compatible with the organic amine are preferably polar groups capable of participating in hydrogen bonding, for example one or more of hydroxyl, carboxyl, amino and sulfonyl groups. Preferably, the polymeric binder comprises terminal hydroxyl and/or carboxyl groups. The polymeric binder preferably comprises a polyester having functional groups that render the polyester compatible with the organic amine. More preferably, the polymeric binder comprises a hydroxyl- and/or carboxyl-terminated polyester.

Other kinds of polymeric binders may be used. Such other kinds of polymeric binders may be homopolymers or copolymers. Such other kinds of polymeric binders may be thermoplastics or elastomers. Some examples of other polymeric binders include, for example, thermoplastic polyurethanes and silicone elastomers.

The polymeric binder may be present in the ink in any suitable amount, preferably in a range of about 0.1 wt % to about 10 wt %, based on total weight of the ink. More preferably, the amount is in a range of about 0.5 wt % to about 10 wt %, or about 0.1 wt % to about 5 wt %, or about 0.5 wt % to about 3 wt %, or about 1 wt % to about 2 wt %.

In a particularly preferred embodiment, the molecular ink comprises: about 61 wt % or more of silver neodecanoate; about 5 wt % to about 50 wt % of amino-2-propanol, 2-ethyl-1-hexylamine or 2-ethyl-2-oxazoline; and about 0.5 wt % to about 3 wt % of a hydroxyl- and/or carboxyl-terminated polyester, all weights based on total weight of the ink.

The molecular ink may optionally comprise a solvent. The solvent is preferably compatible with one or both of the organic amine or polymeric binder. The solvent is preferably compatible with both the organic amine and polymeric binder. The organic amine and/or polymeric binder are preferably dispersible, for example soluble, in the solvent. The solvent is preferably an organic solvent, more preferably a non-aromatic organic solvent. Non-aromatic organic solvents include, for example, glycol ethers (e.g. dipropylene glycol methyl ether), alcohols (e.g. methylcyclohexanols, octanols, heptanols), carbitols (e.g. 2-(2-ethoxyethoxy)ethanol) or any mixture thereof. Alcohols are preferred, preferably $C_1$-$C_{10}$ alkanols, more preferably $C_6$-$C_8$ alkanols, for example octanols. When used, the solvent may be present in the ink in any suitable amount, preferably in a range of about 1 wt % to about 50 wt %, based on total weight of the ink. More preferably, the amount is in a range of about 2 wt % to about 50 wt %, or about 5 wt % to about 50 wt %, or about 5 wt % to about 40 wt %, or about 5 wt % to about 20 wt %. When present, the solvent generally makes up the balance of the ink.

The ink may have a viscosity in a range of about 1 cP to about 50,000 cP. For example, the viscosity of the ink may be in a range of about 1 cP to about 15,000 cP.

The relative amounts of each component of the ink may have an important role in tuning the dispersibility (e.g. solubility) of the silver carboxylate in the ink while providing lower viscosity and lower processing temperatures than existing silver neodecanoate inks. The preferred embodiments of the amounts of each component in the ink leads to inks having particularly improved processing temperature at lower viscosity and higher silver loading.

The ink may be deposited on a substrate by any suitable method to form a non-conductive trace of the ink on the substrate. The ink is particularly suited for printing, for example, screen printing, inkjet printing, flexography printing (e.g. stamps), gravure printing, off-set printing, airbrushing, aerosol printing, typesetting, plotting or any other method. The ink is uniquely optimizable for a variety of different printing techniques.

After deposition on the substrate, drying and decomposing the silver carboxylate within the non-conductive trace forms a conductive trace. Drying and decomposition may be accomplished by any suitable technique, where the techniques and conditions are guided by the type of substrate on which the traces are deposited and the type of silver carboxylate in the ink. For example, drying the ink and decomposing the silver carboxylate may be accomplished by heating and/or photonic sintering.

In one technique, heating the substrate dries and sinters the trace to form the conductive trace. Sintering decomposes the silver carboxylate to form conductive particles (for example nanoparticles) of the silver. It is an advantage that heating may be performed at a relatively low temperature range of less than about 185° C., especially about 150-185° C., or about 150-175° C., while producing relatively highly conductive silver traces. While the ability to sinter at lower temperature is an advantage of the ink, heating may be performed at higher temperatures, if desired, for example at temperatures of about 185° C. or higher or up to a temperature of about 250° C.

Heating is preferably performed for a time of about 3 hours or less, more preferably about 2 hours or less, for example a time in a range of about 1-180 minutes, or about 2-120 minutes. Heating is performed at a sufficient balance between temperature and time to sinter the trace on the substrate to form a conductive trace. The type of heating apparatus also factors into the temperature and time required for sintering. Sintering may be performed with the substrate under an oxidizing atmosphere (e.g. air) or an inert atmosphere (e.g. nitrogen and/or argon gas).

In another technique, a photonic sintering system may feature a high intensity lamp (e.g. a pulsed xenon lamp) that delivers a broadband spectrum of light. The lamp may deliver about 5-20 J/cm$^2$ in energy to the traces. Pulse widths are preferably in a range of about 0.58-1.5 ms. Driving voltages are preferably in a range of about 1.6-2.8 kV. Photonic sintering may be performed under ambient conditions (e.g. in air). Photonic sintering is especially suited for polyethylene terephthalate and polyimide substrates. The use of lower energies (e.g. under 10 J/cm$^2$) increases the compatibility of the ink on low temperature substrates such as polyethylene terephthalate and polyethylene naphthalate, where significantly less substrate damage (e.g. melting and/or warping) occurs with silver neodecanoate-based inks containing amines as described herein.

A conductive trace formed by drying and sintering the ink on the substrate may be of any desired thickness and width. It is an advantage that the ink may be dried and sintered to form a conductive trace that is relatively thin and/or narrow, while maintaining relatively high conductivity (i.e. relatively low resistivity). Further, the sintered traces formed from the ink may be flexible, being able to pass the ASTM F1683-02 flex & crease test without any open circuit breaks (i.e. without open fails). The lowest possible change in resistance is necessary in manufacturing applications. Open circuit breaks are defined as a total loss in conductivity (i.e. infinite resistivity).

The substrate may be any suitable surface, especially printable surface. Printable surfaces may include, for example polyethylene terephthalate (PET) (e.g. Melinex™), polyethylene naphthalate (PEN), polyolefin (e.g. silica-filled polyolefin (Teslin™)), polydimethylsiloxane (PDMS), polystyrene, acrylonitrile/butadiene/styrene, polycarbonate, polyimide (e.g. Kapton™), thermoplastic polyurethane (TPU), silicone membranes, wool, silk, cotton, flax, jute, modal, bamboo, nylon, polyester, acrylic, aramid, spandex, polylactide, paper, glass, coated glass (e.g. ITO-coated glass), metal, dielectric coatings, among others.

The deposited conductive trace on the substrate may be incorporated into an electronic device, for example electrical circuits, conductive bus bars (e.g. for photovoltaic cells), sensors (e.g. touch sensors, wearable sensors), antennae (e.g. RFID antennae), thin film transistors, diodes, smart packaging (e.g. smart drug packaging), conformable inserts in equipment and/or vehicles, and multilayer circuits and MIM devices including low pass filters, frequency selective surfaces, transistors and antenna on conformable surfaces that can withstand high temperatures. The ink enables miniaturization of such electronic devices.

EXAMPLES

Example 1: Silver Neodecanoate Inks

A series of silver neodecanoate (AgND)-based inks were formulated as described in Table 1. Inks I1, I2 and I3 were formulated in accordance with the present invention and Inks C1 and C2 are comparative samples of other formulations of AgND-based inks. The inks have various types of carriers which influence the decomposition temperature of the inks. Each ink has a different component that makes up the greatest weight fraction of the carrier, namely an octanol (Ink I1 and Ink C2), an alkylamine (Ink I2), an oxazoline (Ink I3) and a terpene alcohol (Ink C1).

TABLE 1

| Ink Component | Ink I1 | Ink I2 | Ink I3 | Ink I4 | Ink I5 | Ink C1 | Ink C2 |
|---|---|---|---|---|---|---|---|
| silver neodecanoate (wt %) | 70.4 | 76.3 | 74.9 | 78.3 | 79.7 | 60 | 50 |
| amino-2-propanol (wt %) | 10.0 | / | / | / | / | / | / |
| 2-ethyl-1-hexylamine (wt %) | / | 14.9 | / | / | / | / | / |
| 2-ethyl-2-oxazoline | / | / | 14.7 | 12.8 | 10.7 | / | / |
| Rokrapol™ 7075 (wt %) | 1.5 | 1.6 | 1.6 | 1.2 | 1.6 | 1.6 | / |
| ethylcellulose 46 cp (wt %) | / | / | / | / | / | / | 4.0 |
| octanol (wt %) | 18.1 | 7.2 | 8.8 | 7.7 | 8.0 | / | 34.5 |
| terpineol (wt %) | / | / | / | / | / | 38.4 | / |
| diethylbenzene (wt %) | / | / | / | / | / | / | 11.5 |

The inks containing 1-amino-2-propanol (a hydroxyamine), 2-ethyl-1-hexylamine (an alkylamine) and 2-ethyl-2-oxazoline (an oxazoline) were prepared by first preparing a concentrated suspension of the silver neodecanoate salt in octanol. The 1-amino-2-propanol, 2-ethyl-1-hexylamine or 2-ethyl-2-oxazoline were then slowly incorporated into the suspension using a mortar and pestle and mixed until a clear homogenous viscous solution formed. The other inks were prepared by combining all components and mixing in a plenary mixer until the solutions were homogenous. One of two polymeric binders was added in the inks: Rokrapol™ 7075 (a polyester) or ethyl cellulose 46 cP.

The viscosities of the inks were determined as a function of AgND loading. For these tests, the silver neodecanoate component of the ink was diluted with the respective carrier and amine in the same ratio to the formulations in Table 1. The viscosities of these inks were measured using a Brookfield RV-DV-III ultra Rheometer with a UL adapter at 20.5° C.

Figure 2:
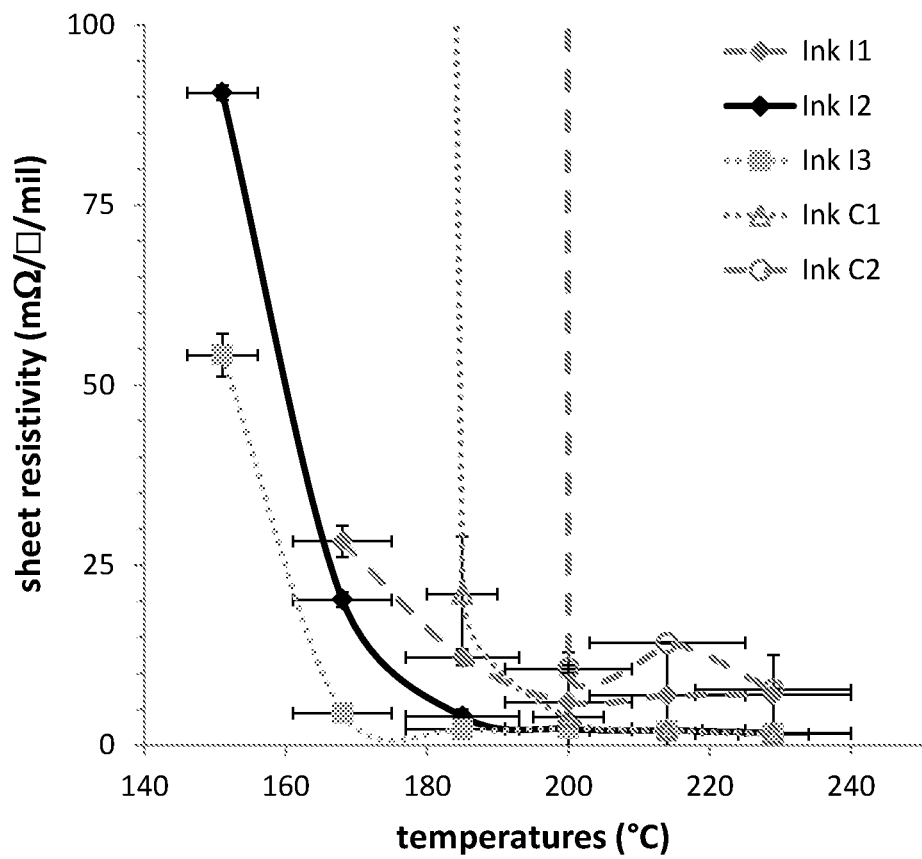
FIG. 2 depicts a graph of sheet resistivity (mΩ/□/mil) of nominal 20 mil lines as a function of sintering temperature (° C.) for silver neodecanoate (AgND) inks of the present invention (Ink I1, Ink I2 and Ink I3) compared to other AgND inks having different formulations (Ink C1 and Ink C2), the inks having been sintered for 45 minutes.

The four inks were screen printed onto 8.5×11" sheets of Kapton™ HPP-ST using a screen with a mesh count of 400 (stainless steel screen with a 19 µm thread diameter and 45 µm mesh opening). The screen comprised lines 10 cm in length and 2-20 mil in width. The printed traces were thermally sintered in air at reflow temperatures (T) varying from 151° C. to 229° C. using the heating programs described in Table 2 (temperatures in Table 2 correspond to the target temperature of the oven). The temperatures used to obtain resistivity data in Table 3 and FIG. 2 are temperatures measured by a thermocouple attached to the Kapton™ substrate.

TABLE 2

| Zone | Front | Rear | Time, sec |
|---|---|---|---|
| Pre-heat 1 | 100° C. | 100° C. | 300 |
| Pre-heat 2 | 150° C. | 150° C. | 300 |
| Soak | 160° C. | 160° C. | 300 |
| Reflow | 160-260° C. | 160-260° C. | 2700 |
| Cool | 60° C. | 60° C. | 300 |

The electrical properties of the traces were characterized by measuring the resistance across the 10 cm long traces with an ohm meter. The widths and thickness of the sintered traces were measured using an optical profilometer (Cyber Technologies 3D Surface Profiler). The trace widths can be used to determine the number of squares in each 10-cm long trace, and subsequently used to calculate the sheet resistance. The cross-sectional areas of the traces were calculated by multiplying the measured width and thickness of the trace. Using the thickness measurements, the sheet resistance values for the traces were calculated. The electrical properties of the sintered traces are provided in FIG. 2.

Figure 3:
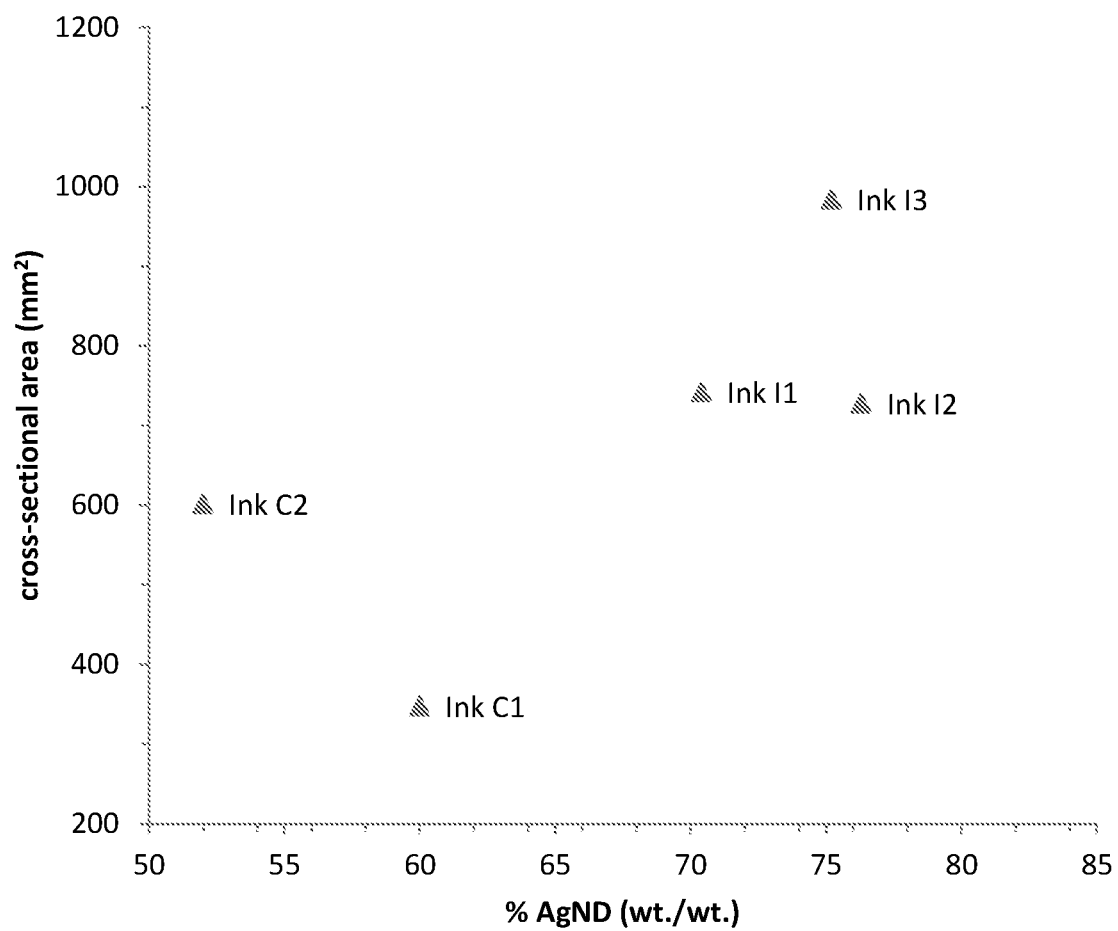
FIG. 3 depicts a graph of cross-sectional area ($mm^2$) of nominal 20 mil lines as a function of AgND weight fraction (wt/wt) after heating traces of various inks (Ink I1, Ink I2, Ink I3, Ink C1 and Ink C2) to 200° C. for 45 minutes.

It is evident from Table 1 that silver neodecanoate loading for Inks I1, I2, I3, I4 and I5 of the present invention can be significantly greater the silver neodecanoate loading in other AgND-based inks. The higher silver neodecanoate loading leads to higher silver deposit as demonstrated by the cross-sectional area of the traces in Table 3. Table 3 provides a comparison of resistance, linewidth, line thickness, cross-sectional area and sheet resistance of the silver traces 10 cm in length made from Ink I1, Ink I2, Ink I3, Ink C1 and Ink C2 after heating to 200° C. for 45 minutes. FIG. 3 shows the relationship between silver neodecanoate loading in the ink and the cross-sectional area of the silver trace after sintering at 200° C. for 45 mins.

It is also evident based on FIG. 2 that the inks can be formulated by the addition of additional amine and octanol to yield inks that have low viscosity (suitable for flexographic printing and plotter-based printing) and maintain a high silver neodecanoate loading (about 48% to about 67%, depending on the amine). It is further evident from FIG. 2 that the Inks I1, I2 and I3 may be sintered at significantly lower temperatures than the Inks C1 and C2 while providing silver traces having good conductivity. In addition, photonic curing of these inks printed on low temperature substrates can be carried out with lower energies that result in significantly less damage to the underlying substrate.

TABLE 3

| Nominal Line width - μm (mil) | ink | Ω | line-width (μm) | line thickness (μm) | cross-sectional area (μm²) | mΩ/□/mil |
|---|---|---|---|---|---|---|
| 508 (20 mil) | Ink I1 | 43 | 651 | 1.1 | 742 | 12.2 |
|  | Ink I2 | 13 | 661 | 1.1 | 728 | 3.7 |
|  | Ink I3 | 6 | 556 | 1.8 | 984 | 2.4 |
|  | Ink C1 | 30 | 572 | 0.6 | 347 | 4.1 |
|  | Ink C2 | 32 | 575 | 1.0 | 602 | 10.6 |
| 381 (15 mil) | Ink I1 | 52 | 549 | 1.1 | 582 | 11.5 |
|  | Ink I2 | 17 | 631 | 0.79 | 499 | 3.4 |
|  | Ink I3 | 8 | 447 | 1.61 | 720 | 2.4 |
|  | Ink C1 | 42 | 444 | 0.67 | 296 | 4.8 |
|  | Ink C2 | 39 | 473 | 1.1 | 498 | 10.8 |
| 254 (10 mil) | Ink I1 | 97 | 461 | 0.91 | 420 | 15.4 |
|  | Ink I2 | 29 | 474 | 0.69 | 327 | 3.7 |
|  | Ink I3 | 13 | 343 | 1.33 | 456 | 2.3 |
|  | Ink C1 | 67 | 326 | 0.66 | 214 | 5.6 |
|  | Ink C2 | 64 | 347 | 0.94 | 325 | 11.6 |
| 127 (5 mil) | Ink I1 | 175 | 334 | 0.59 | 197 | 13.1 |
|  | Ink I2 | 78 | 279 | 0.33 | 92 | 2.8 |
|  | Ink I3 | 34 | 201 | 0.76 | 152 | 2.0 |
|  | Ink C1 | 133 | 219 | 0.41 | 91 | 4.8 |
|  | Ink C2 | 228 | 213 | 0.68 | 144 | 18.7 |

Three further experiments were performed with Ink I3 varying the sintering conditions and the substrate.

In a first experiment, Ink I3 was screen printed onto Kapton® HPP-ST and sintered using the method described above, except that sintering was performed for 30 minutes instead of 45 minutes at a temperature of 200° C. Results are shown in Table 4A and Table 4B.

TABLE 4A

| Nominal line width (mil) | Linewidth (mil) | Slump (mil) | Linewidth (μm) | Line thickness (μm) |
|---|---|---|---|---|
| 1 | 1.88 | 0.44 | 46 | 0.09 |
| 2 | 3.14 | 0.57 | 77 | 0.17 |
| 3 | 4.94 | 1.50 | 121 | 0.36 |
| 5 | 6.82 | 0.91 | 167 | 0.54 |
| 10 | 12.24 | 1.12 | 300 | 1.09 |
| 15 | 16.65 | 0.83 | 408 | 1.24 |
| 20 | 21.39 | 0.69 | 524 | 1.51 |

TABLE 4B

| Nominal line width (mil) | Ω | mΩ/□ | Sheet resistivity mΩ/□/mil | Volume resistivity (μΩ·cm) |
|---|---|---|---|---|
| 1 | 1365 | 628 | 2.22 | 5.7 |
| 2 | 384 | 295.7 | 1.98 | 5.0 |
| 3 | 215 | 260 | 3.68 | 9.4 |
| 5 | 91.8 | 153 | 3.26 | 8.3 |
| 10 | 24.1 | 72 | 3.10 | 7.9 |
| 15 | 12.1 | 49 | 2.41 | 6.1 |
| 20 | 8.1 | 42 | 2.52 | 6.4 |

In a second experiment, Ink I3 was screen printed onto Kapton® and sintered using the method described above, except that sintering was performed for 30 minutes instead of 45 minutes and at a temperature of 180° C. instead of 200° C. Results are shown in Table 5A and Table 5B. Table 5A and Table 5B provide mechanical properties (flexibility as per ASTM F1683-02 flex & crease test).

TABLE 5A

| | | Nominal line width | | |
|---|---|---|---|---|
| | | 1 mil | 2 mil | 3 mil |
| Tensile flex | % change in R | 1.28 ± 0.06 | 1.30 ± 0.03 | 1.58 ± 0.10 |
| | open fails | 0/5 | 0/5 | 0/5 |
| Compressive flex | % change in R | 0.13 ± 0.05 | 0.31 ± 0.02 | 0.34 ± 0.03 |
| | open fails | 0/5 | 0/5 | 0/5 |
| Tensile crease | % change in R | 0.52 ± 0.28 | 0.59 ± 0.05 | 0.67 ± 0.02 |
| | open fails | 0/5 | 0/5 | 0/5 |
| Compressive flex | % change in R | 0.55 ± 0.05 | 0.76 ± 0.08 | 1.01 ± 0.14 |
| | open fails | 0/5 | 0/5 | 0/5 |

TABLE 5B

| | | Nominal line width | | | |
|---|---|---|---|---|---|
| | | 5 mil | 10 mil | 15 mil | 20 mil |
| Tensile flex | % change in R | 1.85 ± 0.10 | 2.44 ± 0.16 | 2.26 ± 0.17 | 2.01 ± 0.50 |
| | open fails | 0/5 | 0/5 | 0/5 | 0/5 |
| Compressive flex | % change in R | 0.8 ± 0.14 | 0.57 ± 0.18 | 0.96 ± 0.1 | 0.56 ± 0.19 |
| | open fails | 0/5 | 0/5 | 0/5 | 0/5 |
| Tensile crease | % change in R | 0.75 ± 0.08 | 0.77 ± 0.26 | 0.7 ± 0.32 | 1.26 ± 0.55 |
| | open fails | 0/5 | 0/5 | 0/5 | 0/5 |
| Compressive flex | % change in R | 1.34 ± 0.24 | 1.80 ± 0.18 | 1.99 ± 0.43 | 1.68 ± 0.55 |
| | open fails | 0/5 | 0/5 | 0/5 | 0/5 |

In a third experiment, Ink I3 was screen printed onto Melinex® through a stainless steel screen with a mesh count of 360 counts/inch (SS360), photonically sintered using intense pulsed light (IPL) sintering (340V/1500 μsec) followed by thermal sintering for 30 minutes at a temperature of 160° C. Results are shown in Table 6A and Table 6B.

TABLE 6A

| Nominal line width (mil) | Linewidth (mil) | Slump (mil) | Linewidth (μm) | Line thickness (μm) |
|---|---|---|---|---|
| 2 | 5.6 | 1.80 | 137 | 0.15 |
| 3 | 7.8 | 1.50 | 192 | 0.36 |
| 5 | 10.2 | 2.62 | 251 | 0.94 |
| 10 | 19.0 | 4.49 | 465 | 1.44 |
| 15 | 21.3 | 3.13 | 521 | 1.4 |
| 20 | 27.1 | 3.53 | 663 | 1.81 |

TABLE 6B

| Nominal line width (mil) | Ω | mΩ/□ | Sheet resistivity mΩ/□/mil | Volume resistivity (μΩ · cm) |
|---|---|---|---|---|
| 2 | 399 | 547 | 3.23 | 8.2 |
| 3 | 354 | 680 | 9.63 | 24.5 |
| 5 | 54 | 136 | 5.02 | 12.7 |
| 10 | 17 | 79 | 4.48 | 11.4 |
| 15 | 11 | 57 | 3.16 | 8.0 |
| 20 | 9 | 60 | 4.25 | 10.8 |

The data in the tables relating to Ink I3 suggests that the combination of 1-octanol and 2-ethyl-oxazoline enables the production of highly conductive traces (volume resistivity values ~10 μΩ·cm for most linewidths). This performance is likely due to the ability to convert the traces to conductive silver using less energy than, for example, Ink C1. The mechanical properties of the traces derived from Ink I3 are also excellent, where the resistance increase following flex and crease testing (ASTM 1683-02) do not increase by more than 3% (Tables 5A and 5B).

Ink I4 was screen printed onto a glass substrate having RMS roughness of 0.06 μm using a stainless steel screen with a mesh count of 360 counts/inch (SS360) and an emulsion thickness of about 7-10 μm and sintered at 200° C. for 30 minutes. The screen-printed patterns had a cross-hatch of 4B. Results are shown in Table 7.

TABLE 7

| Nominal width (μm) | Measured width (μm) | Slump (μm) | Resistivity (μΩ · cm) | Total lines | Fail rate (%) |
|---|---|---|---|---|---|
| 508 | 523 | 7.5 | 10.8 | 10 | 0 |
| 381 | 406 | 12.5 | 10.1 | 10 | 0 |

TABLE 7-continued

| Nominal width (μm) | Measured width (μm) | Slump (μm) | Resistivity (μΩ · cm) | Total lines | Fail rate (%) |
|---|---|---|---|---|---|
| 254 | 280 | 13 | 8.9 | 10 | 0 |
| 127 | 189 | 31 | 6.8 | 10 | 0 |
| 76 | 127 | 25.4 | 1.8 | 10 | 0 |
| 51 | 91 | 20.1 | 1.8 | 10 | 0 |
| 25 | 63 | 18.8 | 4.2 | 10 | 80 |

The data suggests that the combination of polymer binder and ink components allows the silver traces to adhere to the glass substrate quite well (4B), while remaining very smooth (RMS surface roughness ~0.06 μm).

Ink I5 was screen printed onto Melinex® through a high resolution screen comprising woven tungsten wires having a wire diameter of 13 μm, the screen having a mesh count of 430 counts/inch. The screen printed ink was dried for 5 minutes followed by thermal sintering for 30 minutes at 165° C. The results are shown in Table 8. As can be seen in Table 8, traces with measured linewidths under 50 μm with volume resistivity values between 10-20 μΩ·cm can be readily produced. This suggests the ink could be used in the transparent conductive electrode (TCE) applications.

TABLE 8

| Nominal line width (mil) | Average measured line width (μm) | Average measured line thickness (nm) | Average resistivity (μΩ · cm) |
|---|---|---|---|
| 1 | 49 | 49 | 20 |
| 0.8 | 41 | 41 | 9 |

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A molecular ink comprising:
   a silver carboxylate present in the ink in an amount to provide a silver loading of 23 wt % or more in the ink based on total weight of the ink;
   5 wt % to 50 wt % based on total weight of the ink of an organic amine, the organic amine comprising a pyrimidine, a pyrrole, a pyrrolidine, an oxazoline, a piperidine, an isoxazole or a morpholine; and
   0.1 wt % to 10 wt % based on total weight of the ink of a polymeric binder comprising a polyester having functional groups which are polar groups capable of participating in hydrogen bonding that render the polymeric binder compatible with the organic amine, a polyimide having functional groups which are polar groups capable of participating in hydrogen bonding that render the polymeric binder compatible with the organic amine, a polyether imide having functional groups which are polar groups capable of participating in hydrogen bonding that render the polymeric binder compatible with the organic amine, or any mixture thereof, wherein the functional groups are one or more of hydroxyl, carboxyl, amino and sulfonyl groups.

2. The ink according to claim 1, wherein the silver carboxylate comprises silver neodecanoate.

3. The ink according to claim 2, wherein the silver neodecanoate is present in an amount of about 70 wt % or more, based on total weight of the ink.

4. The ink according to claim 1, wherein the organic amine comprises 2-ethyl-2-oxazoline.

5. The ink according to claim 1, wherein the polymeric binder is dispersible in the organic amine.

6. The ink according to claim 1, wherein the polymeric binder comprises hydroxyl- and/or carboxyl-terminated polyester.

7. The ink according to claim 1, wherein the polymeric binder is present in an amount of about 0.5 wt % to about 10 wt %, based on total weight of the ink.

8. The ink according to claim 1, further comprising a solvent.

9. The ink according to claim 8, wherein the solvent comprises an octanol.

10. The ink according to claim 8, wherein the solvent is present in an amount in a range of about 5 wt % to about 40 wt %, based on total weight of the ink.

11. A process for producing a conductive silver trace on a substrate, the process comprising depositing an ink as defined in claim 1 onto a substrate to form a non-conductive trace of the ink on the substrate, and sintering the non-conductive trace of the ink on the substrate to form the conductive silver trace.

12. The process according to claim 11, wherein the sintering is performed at a temperature in a range of about 150° C. to about 185° C.

13. The process according to claim 11, wherein the sintering is performed at a temperature in a range of about 150° C. to about 175° C.

14. The process according to claim 11, wherein the substrate comprises polyethylene terephthalate, polyolefin, polydimethylsiloxane, polystyrene, acrylonitrile/butadiene/styrene, polycarbonate, polyimide, thermoplastic polyurethane, a silicone membrane, wool, silk, cotton, flax, jute, modal, bamboo, nylon, polyester, acrylic, aramid, spandex, polylactide, paper, glass, metal or a dielectric coating.

15. The process according to claim 11, wherein the depositing comprises printing.

* * * * *